United States Patent
Becker et al.

(10) Patent No.: US 10,355,504 B2
(45) Date of Patent: Jul. 16, 2019

(54) METHOD FOR OPERATING A BATTERY UNIT

(71) Applicant: Robert Bosch GmbH, Stuttgart (DE)

(72) Inventors: Jens Becker, Benningen am Neckar (DE); Andre Boehm, Marbach am Neckar (DE)

(73) Assignee: Robert Bosch GmbH, Stuttgart (DE)

(*) Notice: Subject to any disclaimer, the term of this patent is extended or adjusted under 35 U.S.C. 154(b) by 38 days.

(21) Appl. No.: 15/561,487

(22) PCT Filed: Mar. 1, 2016

(86) PCT No.: PCT/EP2016/054265
§ 371 (c)(1),
(2) Date: Sep. 25, 2017

(87) PCT Pub. No.: WO2016/155962
PCT Pub. Date: Oct. 6, 2016

(65) Prior Publication Data
US 2018/0069417 A1    Mar. 8, 2018

(30) Foreign Application Priority Data

Mar. 30, 2015  (DE) .................. 10 2015 205 725

(51) Int. Cl.
*H02J 7/00* (2006.01)
*G01R 31/389* (2019.01)
(Continued)

(52) U.S. Cl.
CPC .......... *H02J 7/0063* (2013.01); *G01R 31/389* (2019.01); *G01R 31/392* (2019.01);
(Continued)

(58) Field of Classification Search
CPC ...................................... H02J 7/0063
(Continued)

(56) References Cited

U.S. PATENT DOCUMENTS

| 2007/0046260 A1 | 3/2007 | Ishikawa |
| 2012/0256592 A1 | 10/2012 | Baughman |
| 2013/0049778 A1 | 2/2013 | Yang et al. |

FOREIGN PATENT DOCUMENTS

| DE | 102009002466 | 10/2010 |
| EP | 2838152 | 2/2015 |

(Continued)

OTHER PUBLICATIONS

International Search Report for Application No. PCT/EP2016/054265 dated May 4, 2016 (English Translation, 2 pages).

*Primary Examiner* — Edward Tso
*Assistant Examiner* — Ahmed H Omar
(74) *Attorney, Agent, or Firm* — Michael Best & Friedrich LLP

(57) ABSTRACT

The invention relates to a method for operating a battery unit comprising at least two series-connected battery cells, wherein a discharge process of at least one battery cell is carried out via a connectable discharge resistor in order to equalize states of charge of the battery cells. According to the invention, the value of the discharge resistance is ascertained during the discharge process of the at least one battery cell, and the previously ascertained value of the discharge resistance is taken into account during a subsequent discharge process of the battery cell.

9 Claims, 1 Drawing Sheet

(51) Int. Cl.
  *G01R 31/392* (2019.01)
  *H01M 10/48* (2006.01)
  *H01M 10/44* (2006.01)
  *H01M 10/42* (2006.01)

(52) U.S. Cl.
  CPC ........... *H01M 10/44* (2013.01); *H01M 10/48* (2013.01); *H02J 7/0014* (2013.01); *H02J 7/0016* (2013.01); *H01M 2010/4271* (2013.01); *H01M 2220/20* (2013.01); *H02J 2007/0067* (2013.01); *Y02T 10/7055* (2013.01)

(58) Field of Classification Search
  USPC ....................................................... 320/118
  See application file for complete search history.

(56) References Cited

FOREIGN PATENT DOCUMENTS

| | | | | |
  |---|---|---|---|---|
  | JP | 2014-116992 | * | 12/2012 | ................ H02J 7/02 |
  | JP | 2014116992 | | 6/2014 | |
  | WO | 2012124845 | | 9/2012 | |
  | WO | 2013138176 | | 9/2013 | |

* cited by examiner

METHOD FOR OPERATING A BATTERY UNIT

BACKGROUND OF THE INVENTION

The invention relates to a method for operating a battery unit having at least two series-connected battery cells. The invention also relates to a use of the method for operating a battery unit in an electric vehicle (EV), in a hybrid vehicle (HEV) or in a plug-in hybrid vehicle (PHEV).

It is apparent that, in future, for static applications such as wind turbines, in motor vehicles which are designed as hybrid vehicles or electric motor vehicles and in electronic devices such as laptops or mobile telephones, new battery systems will be used which are subject to very high demands with regard to reliability, safety, performance and service life.

Here, use is made in particular of so-called lithium-ion battery cells. These are distinguished inter alia by high energy densities, thermal stability and extremely low levels of self-discharge. Lithium-ion battery cells have a positive and a negative electrode at which lithium ions can be reversibly accumulated and released again during a charging process and during a discharge process.

In the development of modern motor vehicles, a reduction of the fuel consumption of the motor vehicle is playing an ever more important role. Possible measures for reducing the consumption of a motor vehicle are to combine the internal combustion engine with an electric drive in a hybrid vehicle or to replace the internal combustion engine with a purely electric drive. The electric drive in hybrid vehicles normally comprises an electric motor which can also be operated as a generator, a battery unit as an energy store which provides a supply to the electric drive, and control electronics.

Plug-in hybrid vehicles furthermore offer the possibility of charging the battery unit via an external energy source. Here, the external energy source may for example be a charging station which is fed via the public electrical supply grid.

Purely electric vehicles, by contrast hybrid vehicles, do not have an internal combustion engine which can drive the motor vehicle, but rather have only an electric drive. Therefore, in the case of these motor vehicles, charging of said battery unit via an external energy source is necessary. Here, the battery unit is nowadays normally in the form of a lithium-ion accumulator, and is also referred to as traction battery.

Battery units in such electric vehicles are normally of modular construction. Here, numerous battery cells are interconnected in series, and form for example in each case one battery module. Further battery modules are for example combined to form in each case one subunit, and share for example a cooling device. A complete battery unit is constructed for example from multiple subunits. A battery control unit is provided for controlling and monitoring the battery unit.

The battery cells that belong to a battery unit generally have different capacities and different self-discharge rates owing to manufacturing tolerances or owing to aging. During the operation of a battery unit, it is necessary for the states of charge of the individual series-connected battery cells to be equalized with one another.

DE 10 2009 002 466 A1 has disclosed a method for equalizing load states of battery cells. Here, a battery cell which has a higher state of charge than other battery cells is partially discharged by means of a discharge resistance which is connected in parallel with respect to the battery cell.

A further method for equalizing load states of battery cells is disclosed in US 2007/0046260. Here, multiple resistances which can be connected in parallel are provided. A control unit calculates how many and which of the resistances provided are connected in parallel for the purposes of discharging the battery cell.

A further method for equalizing load states of battery cells emerges from US 2012/256592. In this case, too, a partial discharge of the battery cell is performed by means of a resistance connected in parallel with respect to the battery cell.

SUMMARY OF THE INVENTION

A method for operating a battery unit which has at least two series-connected battery cells is proposed, wherein, for the purposes of equalizing load states of the battery cells, a discharge process of at least one battery cell is performed via a connectable discharge resistance.

According to the invention, it is provided here that, during the discharge process of the at least one battery cell, the value of the discharge resistance is determined, and, during a subsequent discharge process of the battery cell, the previously determined value of the discharge resistance is taken into consideration.

Specifically, from experience, the values of different discharge resistances are not always equal but exhibit variance within a tolerance range, in particular for manufacturing reasons. Furthermore, the values of discharge resistances change as a result of aging. The value of the discharge resistance is however a significant parameter in the discharge process of the battery cell. The knowledge of the value of the discharge resistance thus permits optimization of the discharge process of the battery cell.

The determined value of the discharge resistance is advantageously stored in a battery control unit. Thus, the value of the discharge resistance is known for the following discharge process. During the manufacture of the battery unit, it is initially the case that a known approximate value for the discharge resistance is stored in the battery control unit. After every discharge process of the battery cell, the stored value of the discharge resistance is overwritten with a new value of the discharge resistance. Here, the stored value of the discharge resistance may be overwritten with the determined value of the discharge resistance. It is also conceivable for the stored value of the discharge resistance to be overwritten with a calculated value which lies between the stored value of the discharge resistance and the determined value of the discharge resistance.

In an advantageous refinement of the invention, a time duration of the discharge process of the battery cell is defined by the determined value of the discharge resistance. The time duration of the discharge process is also a significant parameter in the discharge process of the battery cell. The definition of a suitable time duration of the discharge process thus permits an optimization of the discharge process of the battery cell.

The time duration of the discharge process is advantageously defined by calculation using the following equation:

$$T = \Delta Q * R / U$$

in which the terms represent the following:
  T: Time duration of the discharge process [s]

ΔQ: Charge difference of the battery cell in relation to another battery cell in [As]

R: Value of the discharge resistance [V/A]

U: Voltage of the battery cell [V]

A rest phase is preferably provided before the start of the discharge process of the battery cell. Neither a charging process nor a discharge process of the battery cell, but only at most a self-discharge process, occurs during the rest phase, the effect of which self-discharge process is however negligible. The rest phase permits a subsequently more exact determination of operating parameters of the battery cell, for example of voltage and state of charge.

The time duration of the discharge process of the battery cell is preferably defined during the rest phase by calculation in accordance with the equation above. Here, during the rest phase, the charge of the battery cell and the charge of another battery cell are measured, and the charge difference ΔQ of the battery cell in relation to the other battery cell is calculated. Furthermore, the voltage U of the battery cell is measured during the rest phase. The value R of the discharge resistance is known, and is in particular stored in a battery control unit.

In an advantageous refinement of the invention, at the start of the discharge process, operating parameters of the battery cell, in particular voltage and state of charge of the battery cell, are determined. Also, at the end of the discharge process, operating parameters of the battery cell, in particular voltage and state of charge of the battery cell, are determined. The determination of said operating parameters is preferably performed by the battery control unit.

It is preferably the case that the voltage determined at the start of the discharge process and the state of charge of the battery cell determined at the start of the discharge process are taken into consideration in the determination of the value of the discharge resistance. Likewise, the voltage determined at the end of the discharge process and the state of charge of the battery cell determined at the end of the discharge process are taken into consideration in the determination of the value of the discharge resistance. In particular, the value of the discharge resistance is determined by means of the following equation:

$$R = (U3 + U4)/2 * T/((S3 - S4) * C)$$

in which the terms represent the following:

R: Value of the discharge resistance [V/A]

U3: Voltage of the battery cell at the start of the discharge process [V]

U4: Voltage of the battery cell at the end of the discharge process [V]

T: Time duration of the discharge process [s]

S3: State of charge of the battery cell at the start of the discharge process [%]

S4: State of charge of the battery cell at the end of the discharge process [%]

C: Capacity of the battery cell [As]

It is advantageously the case that a defect in the battery unit is identified if the determined value of the discharge resistance overshoots an upper threshold value. The overshooting of an upper threshold value is indicative of, for example, a break in a conductor path or a defective solder joint.

It is advantageously also the case that a defect in the battery unit is identified if the determined value of the discharge resistance undershoots a lower threshold value. The undershooting of a lower threshold value is indicative, for example, of a short circuit.

The method according to the invention is advantageously used for operating a battery unit in an electric vehicle (EV), in a hybrid vehicle (HEV) or in a plug-in hybrid vehicle (PHEV).

By means of the method according to the invention, precise discharging of a battery cell to a desired state of charge is possible. Here, the method according to the invention functions independently of a driving profile or a power profile to which the battery cells of the battery unit are subjected.

A manufacturing-induced variance of the value of the discharge resistance within a tolerance range can be compensated. In this way, it is possible to use relatively inexpensive discharge resistances with relatively great manufacturing-induced variance. Furthermore, in ongoing series production, it is possible to use relatively inexpensive discharge resistances with different rated values. An aging-induced change in the value of the discharge resistance can likewise be compensated.

The number of required discharge processes is reduced. As a result, the range of an electric vehicle (EV), of a hybrid vehicle (HEV) or of a plug-in hybrid vehicle (PHEV) in which the method according to the invention is used is increased. In this way, costs for required recharging of the battery unit are also reduced.

Furthermore, defects in the battery unit, in particular hardware defects in the battery control unit, can be diagnosed during the operation of the battery unit.

BRIEF DESCRIPTION OF THE DRAWINGS

Embodiments of the invention will be discussed in more detail on the basis of the drawings and of the following description.

In the drawings.

DETAILED DESCRIPTION

Figure 1:
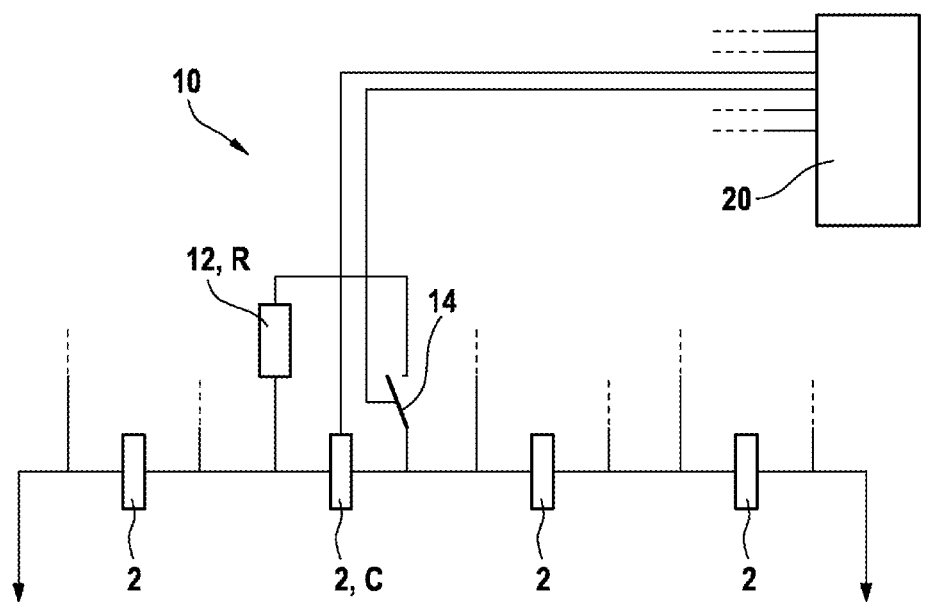
FIG. 1 shows a battery unit which is operated with the method according to invention.

FIG. 1 illustrates a battery unit 10 which is operated with the method according to the invention. The battery unit 10 comprises multiple, in the present case four, battery cells 2. The battery cells 2 are in this case connected in series.

Each battery cell 2 is assigned a discharge resistance 12 and a switch 14. In the illustration shown, only one discharge resistance 12 and one switch 14 of one battery cell 2 are shown. The other battery cells 2 however also comprise in each case one discharge resistance 12 (not illustrated here) and one switch 14 (not illustrated here). By closing the switch 14, the respective discharge resistance 12 can be connected in parallel with respect to the battery cell 2.

After the switch 14 is closed, a discharge process of the battery cell 2 occurs. Said discharge process has a time duration T. The discharge resistance 12 has a value R. The battery cell 2 has a capacity C.

The battery unit 10 furthermore comprises a battery control unit 20. The battery control unit 20 serves for controlling and monitoring the battery unit 10, in particular the battery cells 2.

The battery control unit 20 serves in particular for determining operating parameters of the battery cells 2. In particular, the battery control unit 20 can determine a voltage of the battery cells 2 and a state of charge of the battery cells 2. The battery control unit 20 has, for this purpose, corresponding internal memory areas in which the voltages of the battery cells 2 and the states of charge of the battery cells 2 can be stored.

Furthermore, the battery control unit 20 is connected to the switches 14 of the battery cells 2. Here, the battery control unit 20 can open and close the individual switches 14. The switches 14 of the battery cells 2 are in the present case in the form of semiconductor switches, in particular transistors. The switches 14 of the battery cells 2 may however also be in the form of electromechanical switches, in particular relays.

Furthermore, the battery control unit 20 has corresponding memory areas for storing the value R of the discharge resistance 12 of the battery cell 2. The battery control unit 20 also has a processing unit which calculates the value R of the discharge resistance 12 from measured voltages of the battery cell 2 and from measured states of charge of the battery cell 2, from the capacity C of the battery cell 2 and from the time duration T of the discharge process of the battery cell 2.

During the manufacture of the battery unit 10, an approximate value for the value R of the discharge resistance 12 is initially written into the battery control unit 20. After every discharge process of the battery cell 2 that is performed, a new value R for the discharge resistance 12 is calculated. The previous value R of the discharge resistance 12 is overwritten with the newly calculated value R of the discharge resistance 12.

Figure 2:
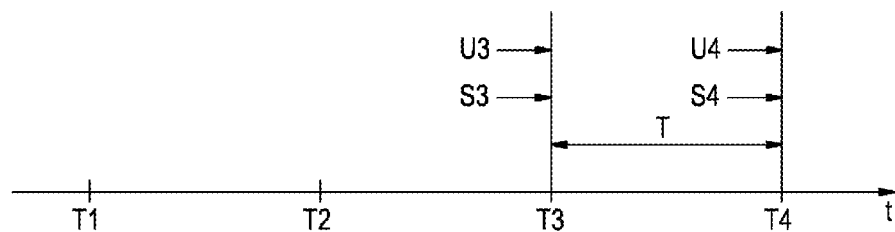
FIG. 2 shows an exemplary chronological sequence of the determination of the value of the discharge resistance during the operation of the battery cell.

FIG. 2 illustrates an exemplary chronological sequence for the determination of the value R of the discharge resistance 12 during the operation of the battery unit 10 and of the battery cell 2 during a time t.

At a first time T1, an electrical consumer is connected. If the battery unit 10 is a traction battery of an electric vehicle, this means for example that the electric vehicle is moved, that is to say the battery unit 10 is connected to the electric motor of the electric vehicle.

At a second time T2, the electrical consumer is disconnected again. This means for example that the electric vehicle comes to a standstill and is shut down at the second time T2. A rest phase for the battery cells 2 begins at the second time T2. This means that neither a charging process nor a discharge process of the battery cells 2 takes place during the rest phase.

During the rest phase, the charge of the battery cell 2 and the charge of another battery cell 2 are measured. From these two charges, a charge difference ΔQ of the battery cell 2 relative to the other battery cell 2 is calculated. Furthermore, during the rest phase, a voltage U of the battery cell 2 is measured.

Subsequently, still during the rest phase, the time duration T of the next discharge process of the battery cell 2 is calculated by means of the following equation:

$$T = \Delta Q * R / U$$

The value R of the discharge resistance 12 is stored in the battery control unit 20 and is thus known.

At a third time T3, a discharge process of the battery cell 2 begins for the purposes of equalizing the state of charge thereof with the state of charge of other battery cells 2. The discharge process of the battery cell 2 has the previously calculated time duration T. For this purpose, the switch 14 is closed and the discharge resistance 12 is then connected in parallel with respect to the battery cell 2. Thus, a discharging current flows from the battery cell 2 through the discharge resistance 12.

At the third time T3, a measurement of a voltage U3 of the battery cell 2 at the start of the discharge process is also performed. Likewise, at the third time T3, a measurement of the state of charge S3 of the battery cell 2 at the start of the discharge process is performed. The voltage U3 of the battery cell 2 at the start of the discharge process corresponds at least approximately to the voltage U of the battery cell 2 during the rest phase. It is thus also possible for a separate measurement of the voltage U3 of the battery cell 2 at the start of the discharge process to be omitted.

The discharge process of the battery cell 2 is ended at a fourth time T4, that is to say after the time duration T. For this purpose, the switch 14 is opened again and the discharge resistance 12 is then no longer connected in parallel with respect to the battery cell 2. Thus, a discharging current no longer flows from the battery cell 2 through the discharge resistance 12.

At the fourth time T4, a measurement of the voltage U4 of the battery cell 2 at the end of the discharge process is also performed. Likewise, at the time T4, a measurement of the state of charge S4 of the battery cell 2 at the end of the discharge process is performed.

The measured values for the voltage U3 of the battery cell 2 at the start of the discharge process, for the voltage U4 of the battery cell 2 at the end of the discharge process, for the state of charge S3 of the battery cell 2 at the start of the discharge process and for the state of charge S4 of the battery cell 2 at the end of the discharge process are stored in the battery control unit 20.

Subsequently, the value R of the discharge resistance 12 of the battery cell 2 is determined.

Here, the value R of the discharge resistance 12 of the battery cell 2 is determined by means of the following equation:

$$R = (U3 + U4)/2 * T/((S3 - S4) * C)$$

The value R of the discharge resistance 12 of the battery cell 2 calculated by means of said equation is subsequently stored in the battery control unit 20. Here, the previous value R of the discharge resistance 12 of the battery cell 2 is overwritten.

From the determined value R of the discharge resistance 12 of the battery cell 2, a time duration T of the discharge process of the battery cell 2 is subsequently defined. The thus defined time duration T of the discharge process of the battery cell 2 is likewise stored in the battery control unit 20. Here, too, a previously stored time duration T of the discharge process of the battery cell 2 is overwritten.

The invention is not restricted to the described exemplary embodiments and to the aspects highlighted therein. Rather, numerous modifications are possible within the scope specified by the claims, which modifications fall within the routine activities of a person skilled in the art.

The invention claimed is:

1. A method for operating a battery unit (10) having at least two series-connected battery cells (2), the method comprising:
   performing a discharge process of at least one battery cell (2) via a connectable discharge resistance (12) to equalize load states of the battery cells (2),
   determining, during the discharge process of the at least one battery cell (2) and with an electronic control unit, the value (R) of the discharge resistance (12), and
   during a subsequent discharge process of the battery cell (2), taking the previously determined value (R) of the discharge resistance (12) into consideration to calculate a new discharge resistance.

2. The method as claimed in claim 1, wherein the determined value (R) of the discharge resistance (12) is stored in the battery control unit (20).

3. The method as claimed in claim 1, wherein a time duration (T) of the discharge process of the battery cell (2) is defined by the determined value (R) of the discharge resistance (12).

4. The method as claimed in claim 1, wherein a rest phase is provided before the start of the discharge process of the battery cell (2).

5. The method as claimed in claim 4, wherein a time duration (T) of the discharge process of the battery cell (2) is defined during the rest phase.

6. The method as claimed in claim 1, wherein, at the start of the discharge process, voltage (U3) and state of charge (S3) of the battery cell (2) are determined, and in that, at the end of the discharge process, voltage (U4) and state of charge (S4) of the battery cell (2) are determined.

7. The method as claimed in claim 6, wherein voltage (U3) and state of charge (S3) of the battery cell (2) at the start of the discharge process and voltage (U4) and state of charge (S4) of the battery cell (2) at the end of the discharge process are taken into consideration in the determination of the value (R) of the discharge resistance (12).

8. The method as claimed in claim 1, wherein a defect in the battery unit (10) is identified if the determined value (R) of the discharge resistance (12) overshoots an upper threshold value.

9. The method as claimed in claim 1, wherein a defect in the battery unit (10) is identified if the determined value (R) of the discharge resistance (12) undershoots a lower threshold value.

* * * * *